(12) United States Patent
Huang et al.

(10) Patent No.: US 9,659,603 B2
(45) Date of Patent: May 23, 2017

(54) POWER MANAGEMENT CIRCUIT FOR AN ELECTRONIC DEVICE

(71) Applicant: Taiwan Semiconductor Manufacturing Co., Ltd., Hsinchu (TW)

(72) Inventors: Hektor Huang, New Taipei (TW); Yangsyu Lin, New Taipei (TW); Yu-Hao Hsu, Tainan (TW); Chia-En Huang, Hsinchu County (TW); Chiting Cheng, Taichung (TW); Chen-Lin Yang, Hsinchu County (TW); Jung-Ping Yang, Hsinchu County (TW); Cheng Hung Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/980,287

(22) Filed: Dec. 28, 2015

(65) Prior Publication Data

US 2017/0040042 A1    Feb. 9, 2017

Related U.S. Application Data

(60) Provisional application No. 62/201,290, filed on Aug. 5, 2015.

(51) Int. Cl.
*G11C 5/14*    (2006.01)
*H02J 4/00*    (2006.01)

(52) U.S. Cl.
CPC .............. *G11C 5/147* (2013.01); *H02J 4/00* (2013.01)

(58) Field of Classification Search
CPC .................................. G11C 5/147; H02J 4/00
See application file for complete search history.

(56) References Cited

U.S. PATENT DOCUMENTS

| 8,598,854 | B2 | 12/2013 | Soenen et al. |
| 8,629,694 | B1 | 1/2014 | Wang et al. |
| 8,629,706 | B2 | 1/2014 | Chen et al. |
| 8,816,670 | B2 | 8/2014 | Lee et al. |

(Continued)

*Primary Examiner* — Khamdan Alrobaie
(74) *Attorney, Agent, or Firm* — Sterne, Kessler, Goldstein & Fox P.L.L.C.

(57) ABSTRACT

A power management circuit for an electronic device sequentially activates and/or deactivates electronic circuits of the electronic device. The power management circuit provides a first group of one or more circuit power management signals to activate and/or deactivate a first electronic circuit from among the electronic circuits. Thereafter, the power management circuit provides a corresponding power management signal from among a second group of the one or more circuit power management signals that corresponds to a portion of the first electronic circuit that has been activated and/or deactivated by the first group of the one or more circuit power management signals to activate and/or deactivate a portion of a second electronic circuit from among the electronic circuits. The power management circuit continues to sequentially provide each of the one or more circuit power management signals in a similar manner until the electronic circuits of the electronic device have been activated and/or deactivated.

20 Claims, 6 Drawing Sheets

(56) References Cited

U.S. PATENT DOCUMENTS

| | | |
|---|---|---|
| 8,957,647 B2 | 2/2015 | Yang |
| 9,069,370 B2 | 6/2015 | Soenen et al. |
| 2011/0198923 A1* | 8/2011 | Cheng ................... G06F 1/26 307/31 |
| 2012/0176186 A1 | 7/2012 | Chen et al. |
| 2013/0241510 A1 | 9/2013 | Shi et al. |
| 2013/0264873 A1* | 10/2013 | Katou ..................... H02J 4/00 307/31 |
| 2013/0307516 A1 | 11/2013 | Horng et al. |
| 2013/0320944 A1 | 12/2013 | Siao |
| 2014/0266114 A1 | 9/2014 | Chern et al. |
| 2015/0234403 A1 | 8/2015 | Siao et al. |
| 2015/0357918 A1 | 12/2015 | Roth et al. |
| 2016/0141005 A1* | 5/2016 | Lee ....................... G11C 5/145 365/226 |

\* cited by examiner

POWER MANAGEMENT CIRCUIT FOR AN ELECTRONIC DEVICE

CROSS-REFERENCE TO RELATED APPLICATIONS

The present application claims the benefit of U.S. Provisional Patent Appl. No. 62/201,290, filed Aug. 5, 2015, which is incorporated herein by reference in its entirety.

BACKGROUND

An electronic device includes one or more active components, such as one or more transistors to provide an example, and/or one or more passive components, such as one or more resistors, one or more capacitors, and/or one or more inductors to provide some examples, that are interconnected to form multiple electronic circuits. The multiple electronic circuits are activated and/or deactivated to perform one or more functions of the electronic device. Not all of the multiple electronic circuits are activated or deactivated at the same time as simultaneous activation or deactivation of the multiple electronic circuits degrades performance of the electronic device. For example, the simultaneous activation or deactivation of the multiple electronic circuits introduces transients into the electronic device thereby degrading the performance of the electronic device. As another example, the simultaneous activation or deactivation of the multiple electronic circuits activates some of the multiple electronic circuits that are currently not needed to perform the one or more functions thereby unnecessarily loading a power supply of the electronic device which degrades the performance of the electronic device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
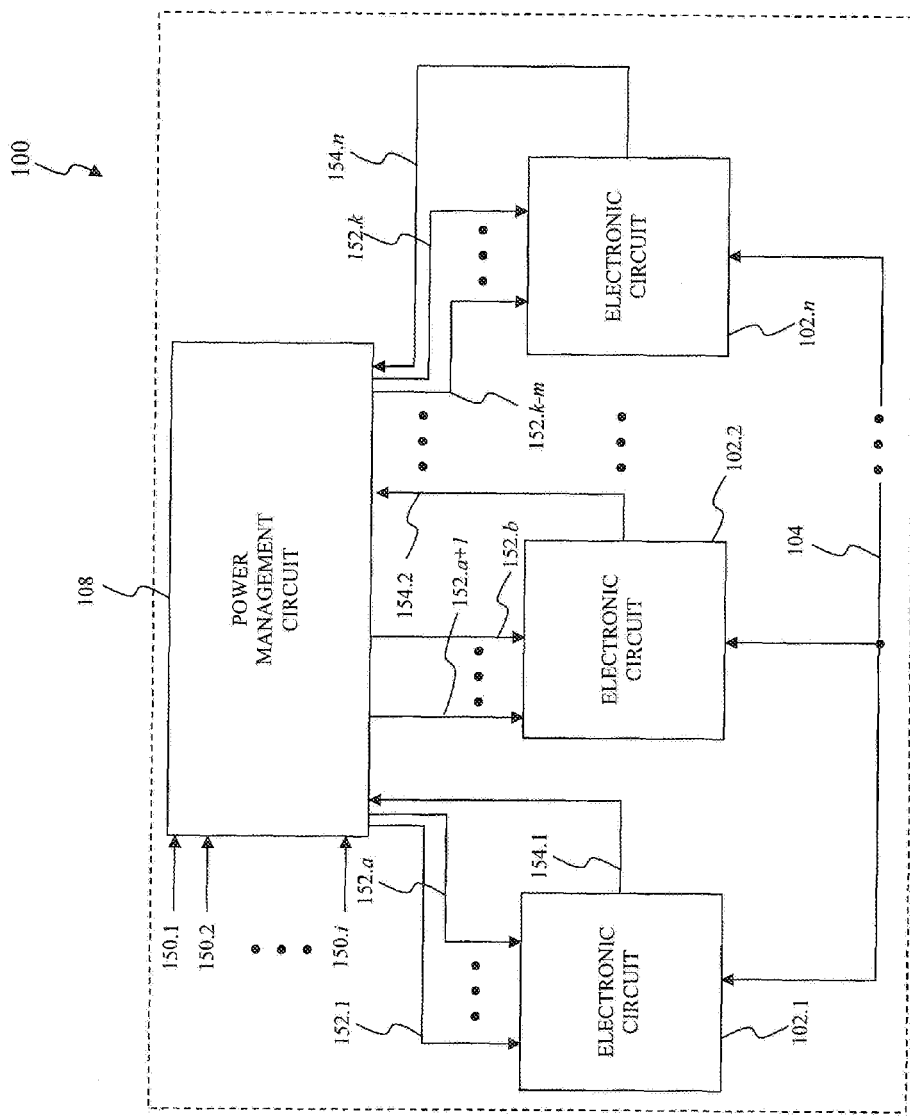
FIG. 1A illustrates a block diagram an exemplary electronic device according to an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Overview

A power management circuit for an electronic device is disclosed that sequentially activates and/or deactivates electronic circuits of the electronic device. The power management circuit provides a first group of one or more circuit power management signals to activate and/or deactivate a first electronic circuit from among the electronic circuits. Thereafter, the power management circuit provides a corresponding power management signal from among a second group of the one or more circuit power management signals that corresponds to a portion of the first electronic circuit that has been activated and/or deactivated by the first group of the one or more circuit power management signals to activate and/or deactivate a portion of a second electronic circuit from among the electronic circuits. The power management circuit continues to sequentially provide each of the one or more circuit power management signals in a similar manner until the electronic circuits of the electronic device have been activated and/or deactivated.

Exemplary Electronic Device

Figure 1B:
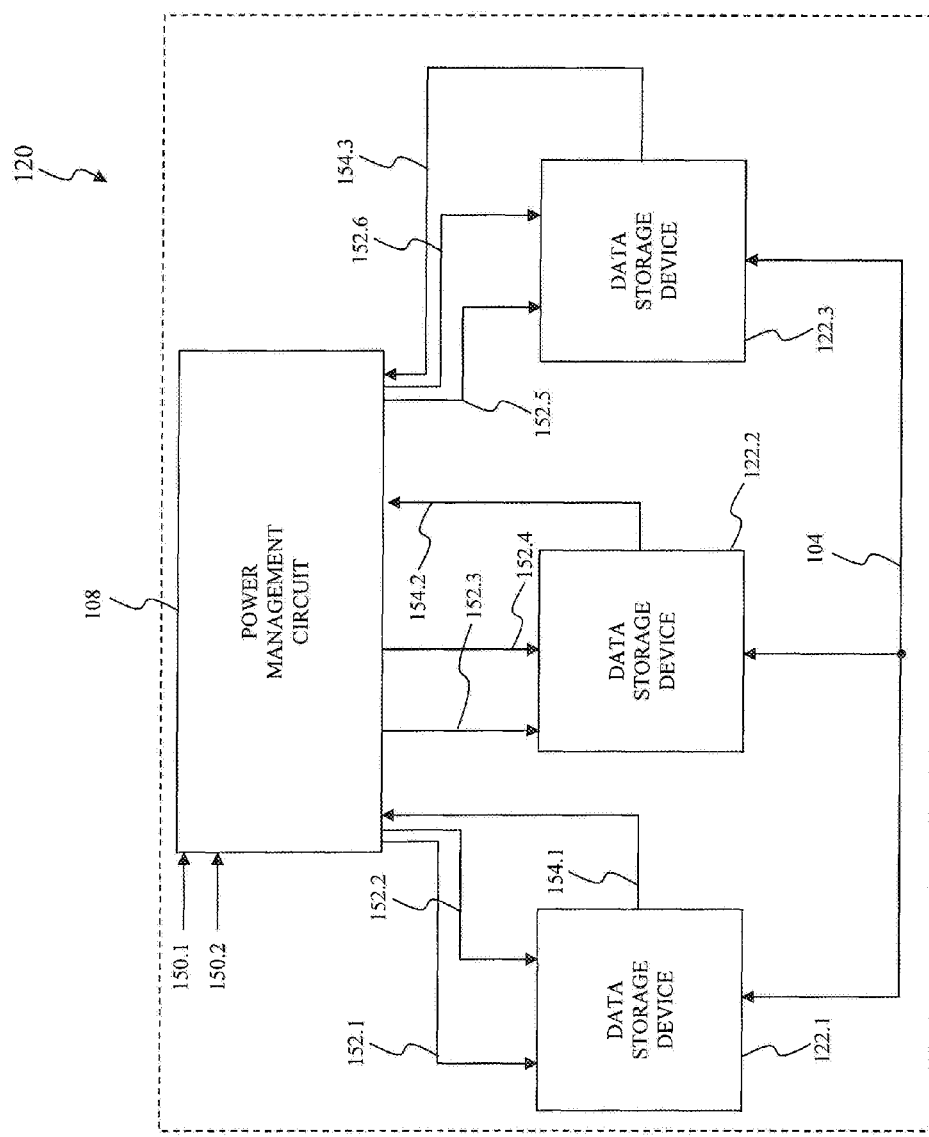
FIG. 1B illustrates a block diagram of an exemplary memory storage device representing an exemplary embodiment of the electronic device of FIG. 1A.

FIG. 1A illustrates a block diagram an exemplary electronic device 100 according to an exemplary embodiment of the present disclosure and FIG. 1B illustrates a block diagram of an exemplary memory storage device representing an exemplary embodiment of the electronic device of FIG. 1A. The electronic device 100 includes components, such as one or more active components and/or one or more passive components to provide some examples, which are interconnected to perform one or more functions. In an exemplary embodiment, the components are formed onto one or more semiconductor substrates, such as one or more silicon semiconductor substrates to provide an example, to form an integrated circuit. The one or more active components include one or more transistors to provide an example and/or the one or more passive components include one or more resistors, one or more capacitors, and/or one or more inductors to provide some examples. However, those of ordinary skill in the relevant art(s) will recognize that other active components and/or other passive components are possible without departing from the spirit and scope of the present disclosure. The one or more functions can include one or more analog functions, one or more digital functions, or one or more mixed signal functions. Typically, the one or more analog functions operate on continuous analog signals using analog circuitry, the one or more digital functions operate on discrete digital signals using digital circuitry, and the one or more mixed signal functions represent a combination of the one or more analog functions and the one or more digital functions.

For example, as illustrated in FIG. 1B, a memory storage device 120 can represent an exemplary embodiment of the electronic device 100. The memory storage device 120 writes information to one or more data storage devices 122.1 through 122.3 or reads information from the data storage devices 122.1 through 122.3. Although the memory storage device 120 is described as having three data storage devices 122.1 through 122.3, this is for illustrative purposes only. Those of ordinary skill in the relevant art(s) will recognize that the memory storage device 120 can include any suitable number of data storage devices 122 without departing from the spirit and scope of the present disclosure. The one or more data storage devices 122.1 through 122.3 can be implemented as volatile memory, such as random access memory (RAM), which requires power to maintain the information or non-volatile memory, such as read-only memory (ROM), which maintains the information even when not powered. The RAM can be implemented as dynamic random-access memory (DRAM), static random-access memory (SRAM), and/or non-volatile random-access memory (NVRAM), such as flash memory to provide an example.

As illustrated in FIG. 1A, the components of the electronic device 100 are physically or logically separated into electronic circuits 102.1 through 102.$n$ that are interconnected via an electronic interface 104 to perform the one or more functions. The electronic interface 104 routes various communications among the electronic circuits 102.1 through 102.$n$. The electronic interface 104 can be implemented as a series of wired and/or wireless interconnections among the electronic circuits 102.1 through 102.$n$. The interconnections of the electronic interface 104 can be arranged to form a parallel interface to route communication among the electronic circuits 102.1 through 102.$n$, a serial interface to route communication among the electronic circuits 102.1 through or any combination thereof.

The electronic device 100 additionally includes a power management circuit 108 to activate and/or deactivate the electronic circuits 102.1 through 102.$n$. The power management circuit 108 receives device power management device signals 150.1 through 150.$i$ that are associated with the electronic circuits 102.1 through 102.$n$. Herein, the device power management device signals 150 are referred to as device signals 150 for simplicity. In an exemplary embodiment, the electronic device 100 may be incorporated within or coupled to an electrical device or host device. In this exemplary embodiment, the electrical device or host device provides the device signals 150 to the electronic device 100. Each of the device signals 150 can be set to a first logical value, such as a logical one to provide an example, to activate its corresponding components of one or more of the electronic circuits 102.1 through 102.$n$ or to a second logical value, such as a logical zero to provide an example, to deactivate its corresponding components of one or more of the electronic circuits 102.1 through 102.$n$.

In another exemplary embodiment, the electronic device 100 is configured to operate in a sleep mode of operation by setting a first group of one or more of the device signals 150 to the first logical value to activate their corresponding components of one or more of the electronic circuits 102.1 through 102.$n$ and by setting a second group of one or more of the device signals 150 to the second logical value to deactivate their corresponding components of one or more of the electronic circuits 102.1 through 102.$n$. In this other exemplary embodiment, each of the one or more of the electronic circuits 102.1 through 102.$n$ can include one or more microprocessors, one or more DSPs, one or more microcontrollers, or one or more ASICs for controlling overall operation of the electronic device 100. The electronic device 100 is configured to operate in the sleep mode of operation by setting the first group of one or more of the device signals 150 corresponding to the one or more microprocessors, the one or more DSPs, the one or more microcontrollers, or the one or more ASICs to the first logical value and by setting a second group of one or more of the device signals 150 corresponding to other components of the electronic circuits 102.1 through 102.$n$ to the second logical value.

In a further exemplary embodiment, the components of the electronic circuits 102.1 through 102.$n$ are assigned to various priorities. Those components of the electronic circuits 102.1 through 102.$n$ that require more power or more time to activate and/or deactivate are assigned to a higher priority than those components of the electronic circuits 102.1 through 102.$n$ that require less power or less time to activate and/or deactivate. Thus, components of the highest priority can be given more power or more time to activate and/or deactivate by setting their corresponding device signals 150. Additionally, a first group of the components of the electronic circuits 102.1 through 102.$n$, such as one or more microprocessors, one or more DSPs, one or more microcontrollers, or one or more ASICs to provide an example, is deemed to be more critical for operation of the electronic device 100 than a second group of the components of the electronic circuits 102.1 through 102.$n$. The first group of the components is assigned to the higher priority than the second group of the components. Thus, components of the highest priority can be activated and/or deactivated independent of components of lower priority by setting their corresponding device signals 150.

As additionally illustrated in FIG. 1A, a power management circuit 108 decodes the device signals 150 to provide a first group of the circuit power management signals 152.1 through 152.$a$. In an exemplary embodiment, the power management circuit 108 simply passes the device signals 150 onto the electronic circuit 102.1 as the first group. Each of the circuit power management signals 152.1 through 152.$k$, herein referred to as circuit signals 152 for simplicity, corresponds to a group of components of the electronic circuits 102.1 through 102.$n$. For example, the circuit signal 152.1 corresponds to a first group of components of the electronic circuit 102.1, the circuit signal 152.$a$ corresponds to an $a^{th}$ group of components of the electronic circuit 102.1, the circuit signal 152.$a$+1 corresponds to a first group of components of the electronic circuit 102.2, the circuit signal 152.$b$ corresponds to a $b^{th}$ group of components of the electronic circuit 102.2, the circuit signal 152.$k$-$m$ corresponds to a first group of components of the electronic circuit 102.$n$, and the circuit signal 152.$k$ corresponds to an $m^{th}$ group of components of the electronic circuit 102.1. In an exemplary embodiment, a, b, and m are equal; however, it is possible that a, b, and m can be different as will be recognized by those of ordinary skill in the relevant art(s).

As another example, as illustrated in FIG. 1B, each of the data storage devices 122.1 through 122.3 includes a memory array for reading and/or writing information, one or more decoders for decoding an address to select one or more memory cells of the memory array to read and/or write the information, one or more amplifiers for reading and/or writing the information to and/from the one or more selected memory cells. In this other example, the circuit signals 152.1, 152.3, and 152.5 correspond to a first group of electronic circuits selected from among the memory array, the one or more decoders, and the one or more amplifiers of their corresponding data storage devices 122.1 through 122.3. Also in this other example, the circuit signals 152.2, 152.4. and 152.6 correspond to a second group of electronic circuits selected from among the memory array, the one or more decoders, and the one or more amplifiers of their corresponding data storage devices 122.1 through 122.3.

Referring back to FIG. 1A, the power management circuit 108 selectively provides the circuit signals 152 to activate and/or deactivate their groups of components of the electronic circuits 102.1 through 102.$n$ in a sequential manner. In an exemplary embodiment, a first circuit signal from among the first group of the circuit power management signals 152.1 through 152.$a$, a first circuit signal from among a second group of the circuit power management signals 152.$a$+1 through 152.$b$, and a first circuit signal from among an $n^{th}$ group of the circuit power management signals 152.$k$-$m$ through 152.$k$ correspond to a first group of components of the electronic circuit 102.1, a first group of components of the electronic circuit 102.2, and a first group of components of the electronic circuit 102.$n$, respectively. In this exemplary embodiment, the power management circuit 108 selectively provides the first circuit signal from among the first group of circuit signals 152.1 through 152.$a$ followed by the first circuit signal from among the second group of circuit signals 152.$a$+1 through 152.$b$ which is followed by the first circuit signal from among the $n^{th}$ group in the sequential manner to sequentially activate and/or deactivate the first group of components of the electronic circuit 102.1, the first group of components of the electronic circuit 102.2, and the first group of components of the electronic circuit 102.$n$. For example as illustrated in FIG. 1B, the circuit signal 152.1, the circuit signal 152.3, and the circuit signal 152.5 correspond to a first group of components of the data storage device 122.1, a first group of components of the data storage device 122.2, and a first group of components of the data storage device 122.3, respectively. The power management circuit 108 selectively provides the circuit signal 152.1 followed by the circuit signal 152.3 which is followed by the circuit signal 152.5 in the sequential manner to sequentially activate and/or deactivate the first group of components of the data storage device 122.1, the first group of components of the data storage device 122.2, and the first group of components of the data storage device 122.3.

Referring back to FIG. 1A, the electronic circuits 102.1 through 102.$n$ provide circuit activation signals 154.1 through 154.$n$, referred to as circuit activation signals 154 for simplicity, when the components corresponding to one or more of the circuit signals 152 have been activated and/or deactivated. Because the power management circuit 108 selectively provides the circuit signals 152 in parallel and receives the circuit activation signals 154 serially, the power management circuit 108 determines a first circuit signal from among the circuit signals 152 which caused a first electronic circuit from among the electronic circuits 102.1 through 102.$n$ to provide its corresponding circuit activation signal 154. Thereafter, the power management circuit 108 generates a second circuit signal from among the circuit signals 152 corresponding to the first circuit signal. As illustrated in FIG. 1A, the power management circuit 108 provides the second circuit signal to a second electronic circuit from among the electronic circuits 102.1 through 102.$n$ to activate and/or deactivate a group of components of the second electronic circuit corresponding to the second circuit signal. In an exemplary embodiment, the power management circuit 108 switches the first circuit signal from a second logical value, such as a logical zero to provide an example, to a first logical value, such as a logical one to provide an example, to provide the first circuit signal to the first electronic circuit. In this exemplary embodiment, the power management circuit 108 switches the second circuit signal from the first logical value to the second logical value, and holds the second circuit signal at the second logical value until receiving a corresponding signal from among the circuit activation signals 154.1 through 154.$n$ from the first electronic circuit that corresponds to the first circuit signal whereby the power management circuit 108 switches the second signal from second logical value to the first logical value.

For example as illustrated in FIG. 1B, the power management circuit 108 determines whether the circuit signal 152.1 or the circuit signal 152.2 caused the data storage device 122.1 to provide the circuit activation signal 154.1. Thereafter in this example, the power management circuit 108 generates the circuit signal 152.3 to activate and/or deactivate the first group of electronic circuits of the data storage device 122.2 when it determines that the circuit signal 152.1 caused the data storage device 122.1 to provide the circuit activation signal 154.1. Otherwise, the power management circuit 108 generates the circuit signal 152.4 to activate and/or deactivate the second group of electronic circuits of the data storage device 122.2 when it determines that the circuit signal 152.2 caused the data storage device 122.1 to provide the circuit activation signal 154.1.

Figure 2A:
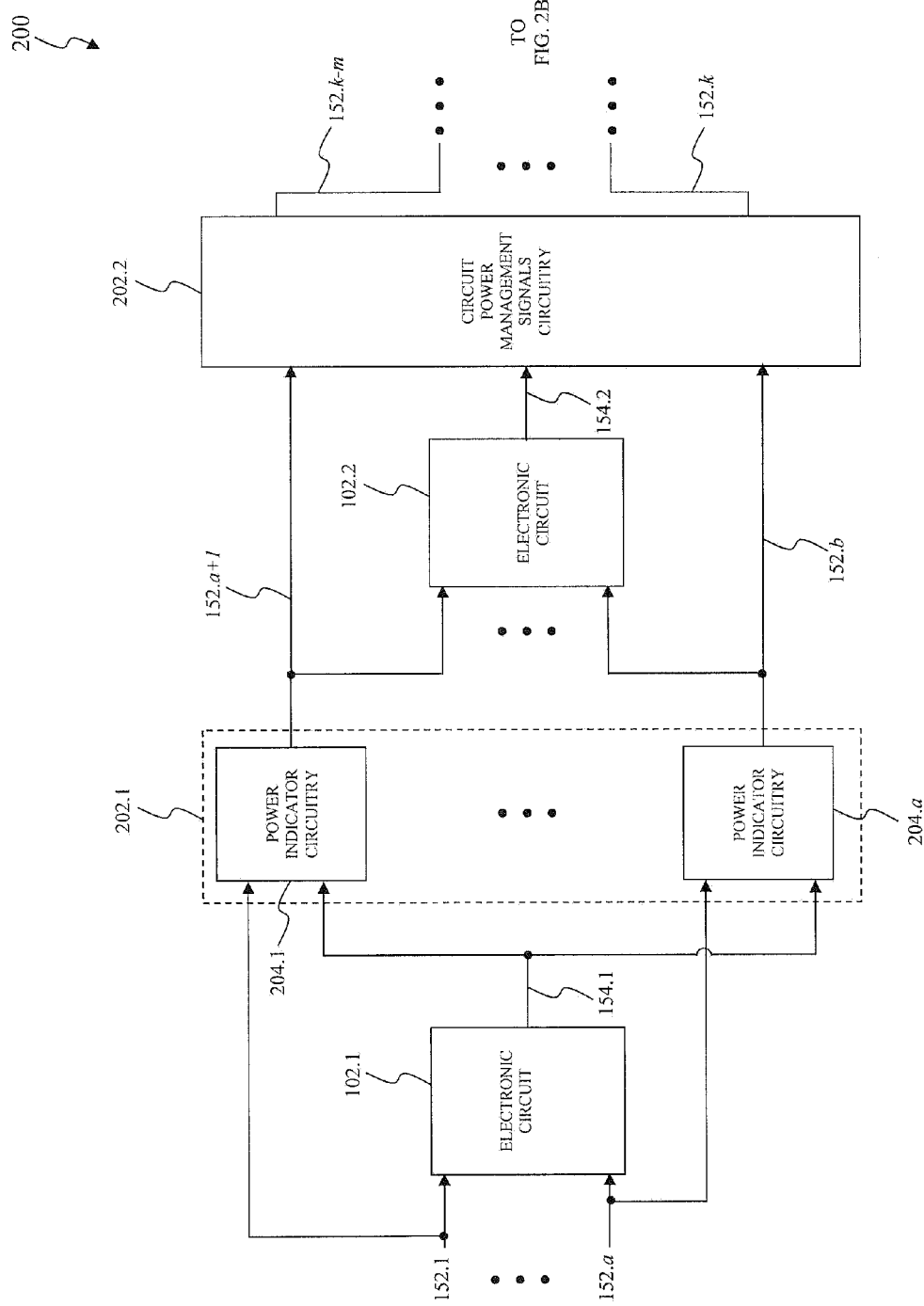
FIG. 2A and FIG. 2B illustrate a block diagram of an exemplary power management circuit that can be implemented within the electronic device of FIG. 1 according to an exemplary embodiment of the present disclosure.
Figure 2B:
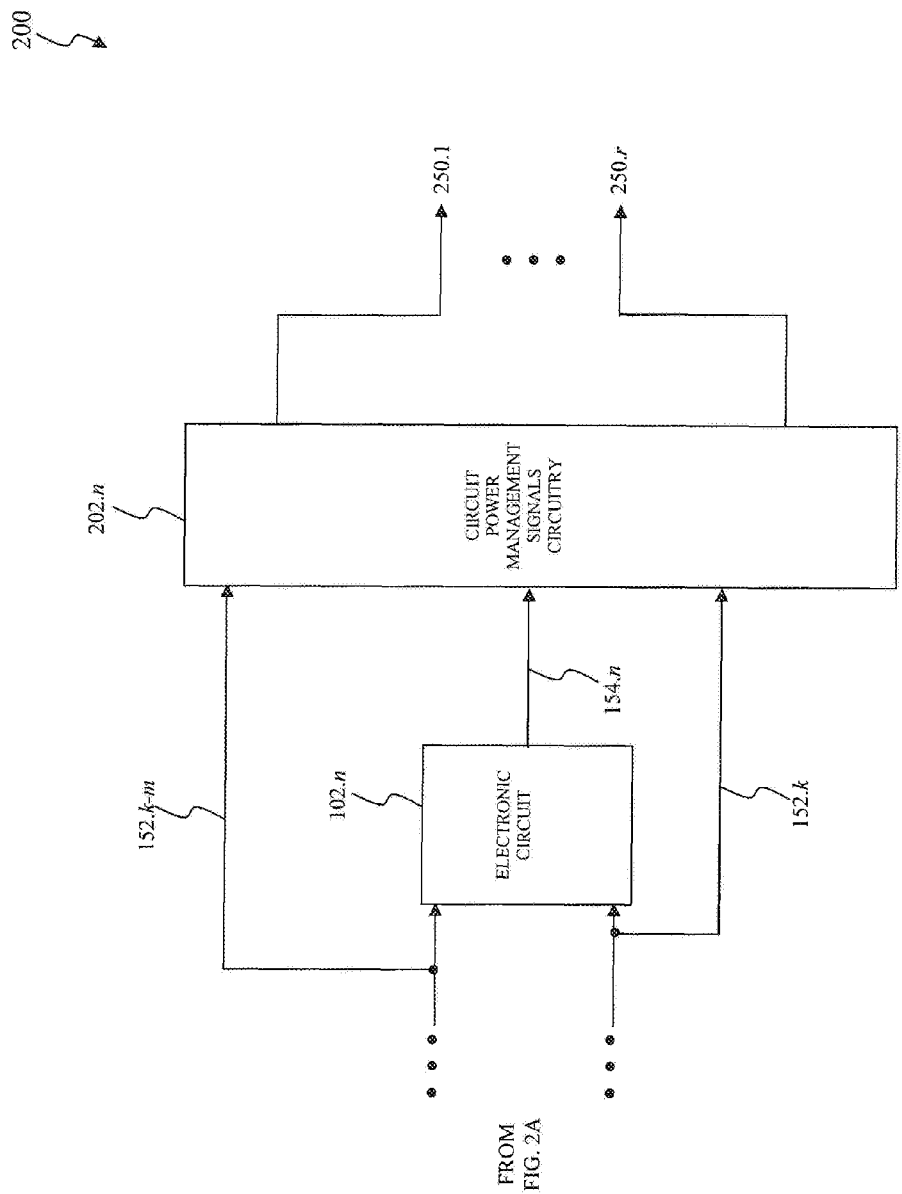

Exemplary Power Management Circuit that can be Implemented within the Electronic Device FIG. 2A and FIG. 2B illustrate a block diagram of an exemplary power management circuit 200 that can be implemented within the electronic device of FIG. 1A according to an exemplary embodiment of the present disclosure. A power management circuit 200 provides the circuit signals 152.1 through 152.$k$ to activate and/or deactivate the electronic circuits 102.1 through 102.$n$ in a sequential manner and receives the circuit activation signals 154.1 through 154.$n$ from the electronic circuits 102.1 through 102.$n$. The power management circuit 200 includes circuit power management circuits 202.1 through 202.$n$. The power management circuit 200 can represent an exemplary embodiment of the power management circuit 108.

As illustrated in FIG. 2A, the circuit power management circuit 202.1 receives the device signals 150 that also operate as the first group of the circuit signals 152.1 through 152.$a$. The circuit power management circuit 202.1 generates the second group of the circuit signals 152.$a$+1 through 152.$b$ based upon the first group of the circuit signals 152.1 through 152.$a$ and the circuit activation signal 154.1. As illustrated in FIG. 2B, the circuit power management circuit 202.$n$ generates circuit activation signals 250.1 through 250.$r$ based upon the circuit signals 152.$k$-$m$ through 152.$k$ and the circuit activation signal 154.$n$. The circuit activation signals 250.1 through 250.$r$ indicate that sequential group of components of the electronic circuits 102.1 through 102.$n$ have been activated and/or deactivated. For example, the circuit activation signal 250.1 indicates that the components of the electronic circuit 102.1 corresponding to the circuit signal 152.1, components of the electronic circuit 102.2 corresponding to the circuit signal 152.$a$+1, and components of the electronic circuit 102.$n$ corresponding to the signal 152.$k$-$m$ have been activated and/or deactivated. In an exemplary embodiment, when the circuit activation signals 250.1 through 250.$r$ have all been switched from a second logical value, such as logical zero, to a first logical value, such as a logical one, the electronic device 100 in its entirety has been activated and/or deactivated.

Each of the circuit power management circuits 202.1 through 202.$n$ includes one or more power indicator circuits 204. The number of power indicator circuits 204 within each of the circuit power management circuits 202.1 through 202.*n* corresponds to the number of the circuit signals 152.1 through 152.*k* received by the circuit power management circuits 202.1 through 202.*n*. For example, as illustrated in FIG. 2A, the circuit power management circuit 202.1 receives the circuit signals 152.1 through 152.*a*. As such, the circuit power management circuit 202.1 includes power indicator circuits 204.1 through 204.*a*. Each of the power indicator circuits 204.1 through 204.*a* operates in a substantially similar manner; therefore, only the power indicator circuit 204.1 is to be described in further detail.

The power indicator circuit 204.1 provides the signal 152.*a*+1 based upon the signal 152.1 and the circuit activation signal 154.1. Specifically, the power indicator circuit 204.1 switches the signal 152.*a*+1 from a first logical value, such as logical one to provide an example, to a second logical value, such as a logical zero to provide an example, and holds the signal 152.*a*+1 at the second logical value until receiving the circuit activation signal 154.1 corresponding to the signal 152.1. The power indicator circuit 204.1 includes one or more logical gates to determine whether the circuit activation signal 154.1 was provided by the electronic circuit 102.1 in response to activating and/or deactivating components corresponding to the signal 152.1.

Thereafter, the power indicator circuits 204.1 switches the signal 152.*a*+1 from second logical value to the first logical value in response to determining that the circuit activation signal 154.1 was provided by the electronic circuit 102.1 in response to activating and/or deactivating components corresponding to the signal 152.1 to provide the signal 152.*a*+1 to the electronic circuit 102.2.

Figure 3:
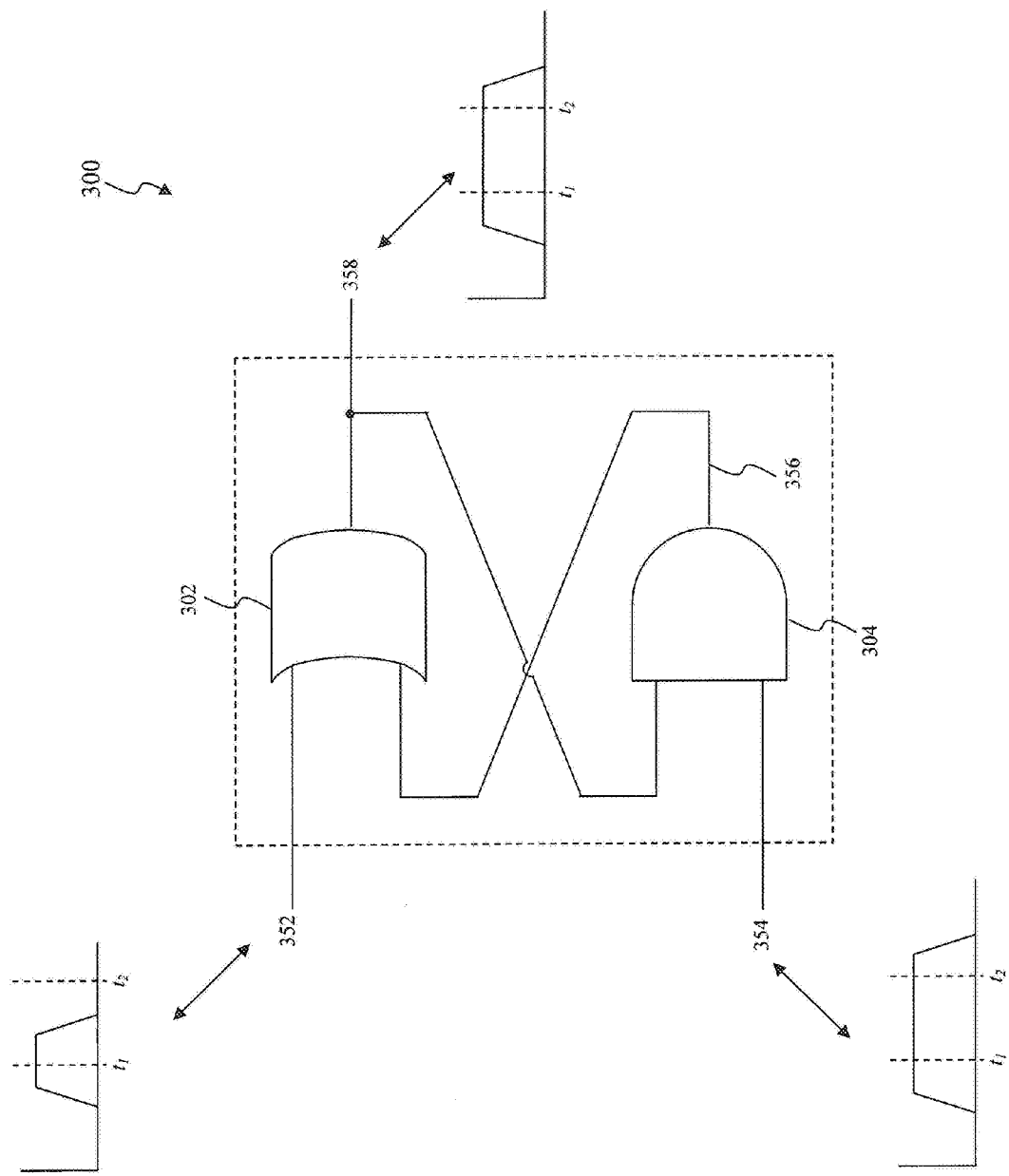
FIG. 3 illustrates a block diagram of exemplary power indicator circuit that can be implemented within the power management circuit of FIG. 2A and FIG. 2B according to an exemplary embodiment of the present disclosure.

Exemplary Power Indicator Circuit that can be Implemented within the Power Management Circuit FIG. 3 illustrates a block diagram of exemplary power indicator circuit 300 that can be implemented within the power management circuit of FIG. 2A and FIG. 2B according to an exemplary embodiment of the present disclosure. As illustrated in FIG. 3, the power indicator circuit 300 includes a logical OR gate 302 and a logical AND gate 304. The power indicator circuit 300 can represent an exemplary embodiment of one or more of the power indicator circuits 204.1 through 204.*i*.

The logical OR gate 302 performs a logical OR operation between a circuit signal 352 and an output 356 of the logical AND gate 304 to provide a circuit signal 358. The circuit signal 352 and the circuit signal 358 can represent an exemplary embodiment of one or more of the circuit signals 152 with the circuit signal 352 being received from a first electronic circuit from among the electronic circuits 102.1 through 102.*n* and the circuit signal 358 being provided to a second electronic circuit from among the electronic circuits 102.1 through 102.*n*. The logical AND gate 304 performs a logical AND operation between a circuit activation signal 354 and the circuit signal 358 to provide the output 356 of the logical AND gate 304. The circuit activation signal 354 can represent an exemplary embodiment of one or more of the circuit activation signals 154.

During operation, the logical OR gate 302 receives the circuit signal 352. As illustrated in FIG. 3, the circuit signal 352 is at a first logical value, such as a logical one to provide an example, at a first time $t_1$. At the first time $t_1$, the output 356 of the logical AND gate 304 is at the first logical value. Therefore, the logical OR gate 302 provides the circuit signal 358 at the first logical value at the first time $t_1$ as illustrated in FIG. 3. The logical AND gate 304 receives the circuit activation signal 354. As illustrated in FIG. 3, the circuit activation signal 354 is at the first logical value at the first time $t_1$. Therefore, the output 356 of the logical AND gate 304 is at the first logical value at the first time $t_1$ as illustrated in FIG. 3.

At the second time $t_2$, the circuit signal 352 is at a second logical value, such as a logical zero to provide an example, and the circuit activation signal 354 is at the first logical value. As the circuit signal 352 transitions from the first logical value to the second logical value, the output 356 of the logical AND gate 304 is at the first logical value. As a result, the logical OR gate 302 provides the circuit signal 358 at the first logical value at the second time $t_2$ as illustrated in FIG. 3.

Exemplary Operation of the Electronic Device

Figure 4:
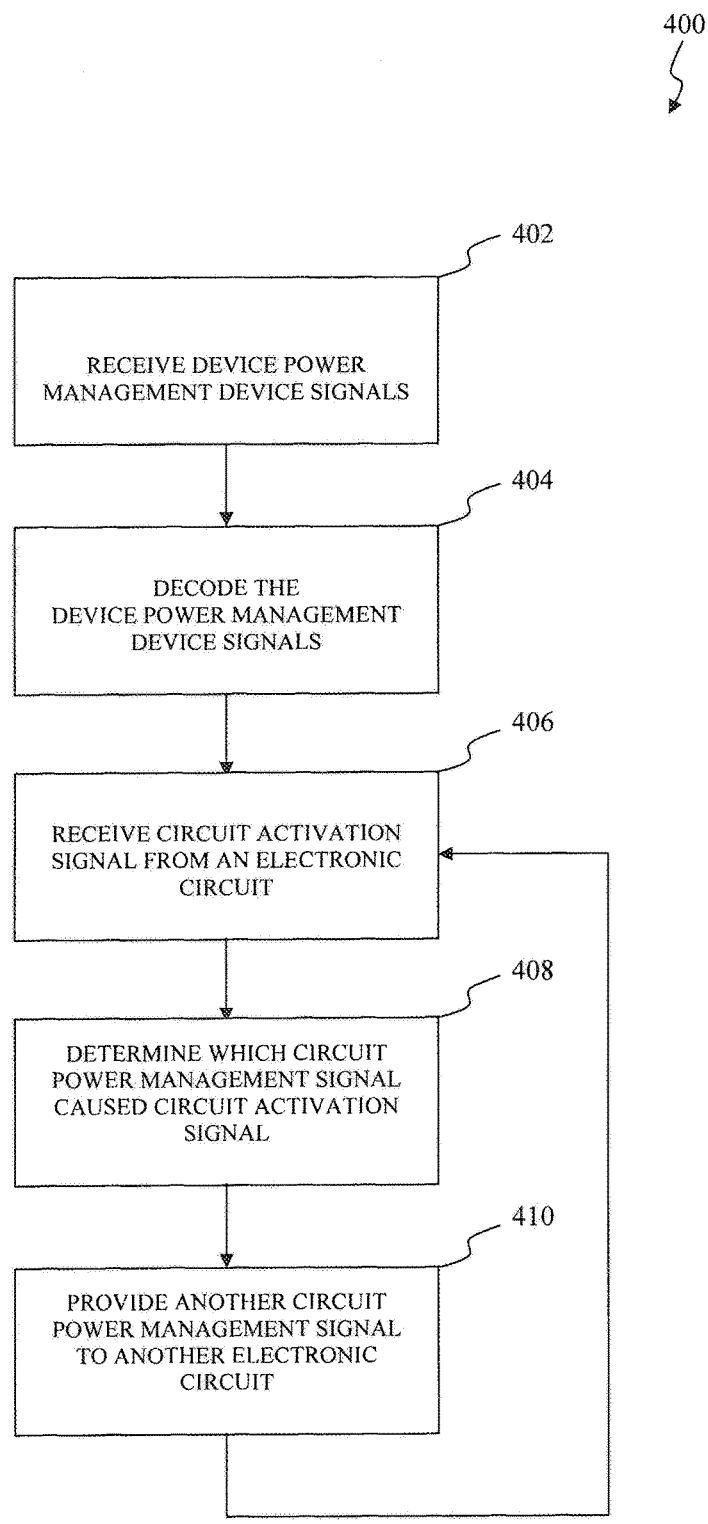
FIG. 4 is a flowchart of an exemplary operational control flow of the electronic device of FIG. 1A according to an exemplary embodiment of the present disclosure.

FIG. 4 is a flowchart of an exemplary operational control flow 400 of the electronic device of FIG. 1A according to an exemplary embodiment of the present disclosure. The disclosure is not limited to this operational description. Rather, it will be apparent to ordinary persons skilled in the relevant art(s) that other operational control flows are within the scope and spirit of the present disclosure. The following discussion describes an exemplary operational control flow 400 of an electronic device, such as the electronic device 100 or the memory storage device 120 to provide some examples.

At step 402, the operational control flow 400 receives device power management device signals, such as the device signals 150 to provide an example. Each of the device power management device signals can be set to a first logical value, such as a logical one to provide an example, to activate its corresponding components of one or more electronic circuits, such as the electronic circuits 102.1 through 102.*n* or the data storage devices 122.1 through 122.3 to provide some examples, or to a second logical value, such as a logical zero to provide an example, to deactivate its corresponding components of one or more of the electronic circuits.

At step 404, the operational control flow 400 decodes the device power management device signals from step 404 to provide a first group of the circuit power management signals, such as the first group of the circuit power management signals 152.1 through 152.*a* to provide an example. In an exemplary embodiment, the power management circuit 108 simply passes the device power management device signals onto a first electronic circuit from among the one or more electronic circuits as the first group of the circuit power management signals.

At step 406, the operational control flow 400 receives a circuit activation signal from an electronic circuit of the electronic device in response to components of the electronic circuit corresponding to one of the circuit power management signals being activated and/or deactivated. For example, the operational control flow 400 receives the circuit activation signal 154.1 from the electronic circuit 102.1 in response to a first group of components of the electronic circuit 1011 corresponding to the circuit signal 152.1 being activated and/or deactivated or in response to an $a^{th}$ group of components of the electronic circuit 102.1 corresponding to the circuit signal 152.*a* being activated and/or deactivated.

At step 408, the operational control flow 400 determines which circuit power management signal from among the circuit power management signals caused the electronic circuit from step 406 to provide the circuit activation signal from step 406. For example, the operational control flow 400 determines the circuit signal 152.1 caused the electronic circuit 102.1 to provide the circuit activation signal 154.1 when the first group of components of the electronic circuit 102.1 have been activated and/or deactivated or the circuit signal 152.*a* caused the electronic circuit 102.1 to provide the circuit activation signal 154.1 when the $a^{th}$ group of components of the electronic circuit 102.1 have been activated and/or deactivated.

At step 410, the operational control flow 400 provides another circuit power management signal from among the circuit power management signals corresponding to the determined circuit power management signal from step 408 to another electronic circuit from among the electronic device. From the example above, the operational control flow 400 provides the circuit signal 152.*a*+1 from among the second group of circuit signals 152.*a*+1 through 152.*b* corresponding to the circuit signal 152.1 when the first group of components of the electronic circuit 102.1 have been activated and/or deactivated to activate and/or deactivate a corresponding (a+1)$^{th}$ group of components of the electronic circuit 102.2. Alternatively, the operational control flow 400 provides the circuit signal 152.*b* from among the second group of circuit signals 152.*a*+1 through 152.*b* corresponding to the circuit signal 152.*a* when the $a^{th}$ group of components of the electronic circuit 102.1 have been activated and/or deactivated to activate and/or deactivate a corresponding $b^{th}$ group of components of the electronic circuit 102.2. Thereafter, the operational control flow 400 reverts to step 406 to receive another circuit activation signal from this other electronic device.

The foregoing Detailed Description discloses an electronic device. The electronic device includes a first electronic circuit and a power management circuit. The first electronic circuit receives a first group of circuit power management signals and provides a circuit activation signal when a first group of components of the first electronic circuit corresponding to a first circuit power management signal from among the first group of circuit power management signals has been activated or deactivated. The power management circuit determines a first circuit power management signal of a second group of circuit power management signals that corresponds to the first circuit power management signal from among the first group of circuit power management signals in response to receiving the circuit activation signal and provides the first circuit power management signal of the second group of circuit power management signals to a second electronic circuit to activate or deactivate a first group of components of the second electronic circuit.

In an exemplary embodiment, the electronic device can be implemented as a memory storage device including a first data storage device and the power management circuit. The first data storage device receives a first group of circuit power management signals, and provides a circuit activation signal when a first group of components of the first data storage device corresponding to a first circuit power management signal from among the first group of circuit power management signals has been activated or deactivated. The power management circuit determines a first circuit power management signal of a second group of circuit power management signals that corresponds to the first circuit power management signal from among the first group of circuit power management signals in response to receiving the circuit activation signal, and provides the first circuit power management signal of the second group of circuit power management signals to a second data storage device to activate or deactivate a first group of components of the second data storage device.

In an exemplary embodiment, the power management circuit includes a first power indicator circuit and a second power indicator circuit. The first power indicator circuit receives a first circuit activation signal from an electronic circuit and a first circuit power management signal from among a plurality of circuit power management signals, determines whether the first circuit activation signal corresponds to the first circuit power management signal, and provides a second power management signal from among the plurality of circuit power management signals when the first circuit activation signal corresponds to the first circuit power management signal. The second power indicator circuit receives the first circuit activation signal from the electronic circuit and a third circuit power management signal from among the plurality of circuit power management signals, determines whether the first circuit activation signal corresponds to the third circuit power management signal, and provides a fourth power management signal from among the plurality of circuit power management signals when the third circuit activation signal corresponds to the first circuit power management signal.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device, comprising:
    a first electronic circuit configured to:
        receive a first group of circuit power management signals, and
        provide a circuit activation signal when a first group of components of the first electronic circuit corresponding to a first circuit power management signal from among the first group of circuit power management signals has been activated or deactivated or a second group of components of the first electronic circuit corresponding to a second circuit power management signal from among the first group of circuit power management signals has been activated or deactivated; and
    a power management circuit configured to:
        determine whether the circuit activation signal corresponds to the first group of components of the first electronic circuit or the second group of components of the first electronic circuit,
        determine a first circuit power management signal of a second group of circuit power management signals when the circuit activation signal corresponds to the first group of components of the first electronic circuit or a second circuit power management signal of the second group of circuit power management signals when the circuit activation signal corresponds to the second group of components of the first electronic circuit, and
        provide the first circuit power management signal of the second group of circuit power management signals to a second electronic circuit to activate or deactivate a first group of components of the second electronic circuit when the circuit activation signal corresponds to the first group of components of the first electronic circuit or the second circuit power management signal of the second group of circuit power management signals to the second electronic circuit to activate or deactivate a second group of components of the second electronic circuit when the circuit activation signal corresponds to the second group of components of the first electronic circuit.

2. The electronic device of claim 1, wherein the power management circuit is further configured to receive a plurality of device power management signals and to provide the plurality of device power management signals as the first group of circuit power management signals.

3. The electronic device of claim 2, wherein the first group of components of the first electronic circuit and the first group of components of the second electronic circuit are assigned to a first priority,
- wherein the second group of components of the first electronic circuit and the second group of components of the second electronic circuit are assigned to a second priority,
- wherein a first device power management signal from among the plurality of device power management signals corresponds to the first priority, and
- wherein a second device power management signal from among the plurality of device power management signals corresponds to the second priority.

4. The electronic device of claim 1, wherein the power management circuit comprises:
- a first power indicator circuit from among a plurality of power indicator circuits configured to:
  - determine whether the first circuit power management signal from among the first group of circuit power management signals corresponds to the circuit activation signal, and
  - provide the first circuit power management signal of the second group of circuit power management signals to the second electronic circuit when the first circuit power management signal corresponds to the circuit activation signal; and
- a second power indicator circuit from among the plurality of power indicator circuits configured to:
  - determine whether the second circuit power management signal from among the first group of circuit power management signals corresponds to the circuit activation signal, and
  - provide the second circuit power management signal of the second group of circuit power management signals to the second electronic circuit when the second circuit power management signal corresponds to the circuit activation signal.

5. The electronic device of claim 4, wherein the power management circuit comprises:
- a logical OR gate; and
- a logical AND gate,
- wherein the logical OR gate is configured to perform a logical OR operation between the first circuit power management signal from among the first group of circuit power management signals and an output of the logical AND gate to provide the first circuit power management signal from among the second group of circuit power management signals, and
- wherein the logical AND gate is configured to perform a logical AND operation between the circuit activation signal and the first circuit power management signal from among the second group of circuit power management signals.

6. The electronic device of claim 1, wherein the first electronic circuit and the second electronic circuit comprise a first data storage device and a second data storage device, respectively.

7. The electronic device of claim 6, wherein the first group of components of the first electronic circuit and the first group of components of the second electronic circuit comprise:
- a memory array of the first data storage device or of the second data storage device,
- one or more decoders of the first data storage device or of the second data storage device, or
- one or more amplifiers of the first data storage device or of the second data storage device.

8. The electronic device of claim 1, wherein the second electronic circuit is configured to provide a second circuit activation signal when the first group of components of the second electronic circuit or the second group of components of the second electronic circuit have been activated or deactivated.

9. The electronic device of claim 8, wherein the power management circuit is further configured to:
- determine whether the second circuit activation signal corresponds to the first group of components of the second electronic circuit or the second group of components of the second electronic circuit,
- determine a first circuit power management signal of a third group of circuit power management signals when the second circuit activation signal corresponds to the first group of components of the second electronic circuit or a second circuit power management signal of the third group of circuit power management signals when the second circuit activation signal corresponds to the second group of components of the second electronic circuit, and
- provide the first circuit power management signal of the third group of circuit power management signals to a third electronic circuit to activate or deactivate a first group of components of the third electronic circuit when the second circuit activation signal corresponds to the first group of components of the second electronic circuit or the second circuit power management signal of the third group of circuit power management signals to the third electronic circuit to activate or deactivate a second group of components of the third electronic circuit when the second circuit activation signal corresponds to the second group of components of the second electronic circuit.

10. The electronic device of claim 9, wherein the first circuit power management signal of the third group of circuit power management signals indicates that the first group of components of the first electronic circuit and the first group of components of the second electronic circuit have been activated or deactivated.

11. A memory storage device, comprising:
- a first data storage device configured to:
  - receive a first group of circuit power management signals, and
  - provide a circuit activation signal when a first group of components of the first data storage device corresponding to a first circuit power management signal from among the first group of circuit power management signals has been activated or deactivated or a second group of components of the first data storage device corresponding to a second circuit power management signal from among the first group of circuit power management signals has been activated or deactivated; and a power management circuit configured to:
  determine whether the circuit activation signal corresponds to the first group of components of the first data storage device or the second group of components of the first data storage device,
  determine a first circuit power management signal of a second group of circuit power management signals when the circuit activation signal corresponds to the first group of components of the first data storage device or a second circuit power management signal of the second group of circuit power management signals when the circuit activation signal corresponds to the second group of components of the first data storage device, and
  provide the first circuit power management signal of the second group of circuit power management signals to a second data storage device to activate or deactivate a first group of components of the second data storage device when the circuit activation signal corresponds to the first group of components of the first data storage device or the second circuit power management signal of the second group of circuit power management signals to the second data storage device to activate or deactivate a second group of components of the second data storage device when the circuit activation signal corresponds to the second group of components of the first data storage device.

12. The memory storage device of claim 11, wherein the first data storage device and the second data storage device are implemented onto a first semiconductor substrate and a second semiconductor substrate, respectively, the first semiconductor substrate and the second semiconductor substrate being coupled to the power management circuit.

13. The memory storage device of claim 11, wherein the first group of components of the first data storage device comprises:
  a memory array,
  one or more decoders, or
  one or more amplifiers.

14. The memory storage device of claim 11, wherein the second data storage device is configured to provide a second circuit activation signal when the first group of components of the second data storage device or the second group of components of the second data storage device have been activated or deactivated been activated or deactivated.

15. The memory storage device of claim 14, wherein the power management circuit is further configured to:
  determine whether the second circuit activation signal corresponds to the first group of components of the second data storage device or the second group of components of the second data storage device,
  determine a first circuit power management signal of a third group of circuit power management signals when the second circuit activation signal corresponds to the first group of components of the second data storage device or a second circuit power management signal of the third group of circuit power management signals when the second circuit activation signal corresponds to the second group of components of the second data storage device, and
  provide the first circuit power management signal of the third group of circuit power management signals to a third data storage device to activate or deactivate a first group of components of the third data storage device when the second circuit activation signal corresponds to the first group of components of the second data storage device or the second circuit power management signal of the third group of circuit power management signals to the third data storage device to activate or deactivate a second group of components of the third data storage device when the second circuit activation signal corresponds to the second group of components of the second data storage device.

16. The memory storage device of claim 11, wherein the power management circuit comprises:
  a first power indicator circuit from among a plurality of power indicator circuits configured to:
    determine whether the first circuit power management signal from among the first group of circuit power management signals corresponds to the circuit activation signal, and
    provide the first circuit power management signal of the second group of circuit power management signals to the second data storage device when the first circuit power management signal corresponds to the circuit activation signal; and
  a second power indicator circuit from among the plurality of power indicator circuits configured to:
    determine whether the second circuit power management signal from among the first group of circuit power management signals corresponds to the circuit activation signal, and
    provide the second circuit power management signal of the second group of circuit power management signals to the second data storage device when the second circuit power management signal corresponds to the circuit activation signal.

17. A power management circuit, comprising:
  a first power indicator circuit configured to:
    receive a circuit activation signal from a first electronic circuit and a first circuit power management signal from among a first plurality of circuit power management signals,
    determine whether the circuit activation signal corresponds to the first circuit power management signal from among the first plurality of circuit power management signals, and
    provide a first circuit power management signal from among a second plurality of circuit power management signals to a second electronic circuit when the circuit activation signal corresponds to the first circuit power management signal from among the first plurality of circuit power management signals; and
  a second power indicator circuit configured to:
    receive the circuit activation signal from the first electronic circuit and a second circuit power management signal from among the first plurality of circuit power management signals,
    determine whether the circuit activation signal corresponds to the second circuit power management signal from among the first plurality of circuit power management signals, and
    provide a second circuit power management signal from among the second plurality of circuit power management signals to the second electronic circuit when the circuit activation signal corresponds to the second circuit power management signal from among the first plurality of circuit power management signals.

18. The power management circuit of claim 17, wherein the first power indicator circuit comprises:

a logical OR gate; and
a logical AND gate,
  wherein the logical OR gate is configured to perform a logical OR operation between the first circuit power management signal from among the first plurality of circuit power management signals and an output of the logical AND gate to provide the first circuit power management signal from among the second plurality of power management signals, and
  wherein the logical AND gate is configured to perform a logical AND operation between the first circuit activation signal and the first power management signal from among the second plurality of power management signals.

19. The power management circuit of claim 17, wherein the circuit activation signal indicates that a first group of components of the first electronic circuit corresponding to the first circuit power management signal from among the first plurality of circuit power management signals has been activated or deactivated or a second group of components of the first electronic circuit corresponding to the second circuit power management signal from among the first plurality of circuit power management signals has been activated or deactivated.

20. The power management circuit of claim 17, wherein the first electronic circuit comprises:
  a data storage device.

\* \* \* \* \*